United States Patent
Wagner et al.

(10) Patent No.: US 8,116,701 B2
(45) Date of Patent: Feb. 14, 2012

(54) CIRCUIT ARRANGEMENT AND METHOD FOR SETTING AN ANALOG OUTPUT SIGNAL

(75) Inventors: Elmar Wagner, Duisburg (DE); Bernd Adler, Neubiberg (DE); Andrea Camuffo, München (DE); Alexander Belitzer, München (DE)

(73) Assignee: Infineon Technologies Delta GmbH, Neubiberg (DE)

( * ) Notice: Subject to any disclaimer, the term of this patent is extended or adjusted under 35 U.S.C. 154(b) by 995 days.

(21) Appl. No.: 11/831,580

(22) Filed: Jul. 31, 2007

(65) Prior Publication Data
US 2008/0048781 A1 Feb. 28, 2008

(30) Foreign Application Priority Data
Jul. 31, 2006 (DE) .......................... 10 2006 035 663

(51) Int. Cl.
*H04B 1/04* (2006.01)
*H04K 3/00* (2006.01)
(52) U.S. Cl. .................. 455/114.3; 455/126; 455/127.1; 375/296
(58) Field of Classification Search .................. 455/126, 455/127.1–127.3, 114.3; 375/296, 297
See application file for complete search history.

(56) References Cited

U.S. PATENT DOCUMENTS

| | | | |
|---|---|---|---|
| 5,337,006 A | 8/1994 | Miyazaki | |
| 6,580,901 B1 | 6/2003 | Mochizuki | |
| 6,919,764 B2 | 7/2005 | Kenington et al. | |
| 6,973,334 B2 | 12/2005 | Katagishi et al. | |
| 7,116,173 B2 | 10/2006 | Tsutsui et al. | |
| 7,120,402 B2* | 10/2006 | Talwalkar et al. | 455/127.4 |
| 7,336,132 B2 | 2/2008 | Tsutsui et al. | |
| 7,650,122 B2* | 1/2010 | Itkin et al. | 455/126 |
| 7,873,334 B2 | 1/2011 | Itkin et al. | |
| 2005/0047521 A1* | 3/2005 | Ishikawa et al. | 375/296 |
| 2005/0054308 A1 | 3/2005 | Vayrynen et al. | |
| 2005/0191975 A1 | 9/2005 | Talwalkar et al. | |
| 2005/0218989 A1 | 10/2005 | Tsutsui et al. | |
| 2006/0226903 A1* | 10/2006 | Muller et al. | 330/149 |
| 2006/0229036 A1* | 10/2006 | Muller et al. | 455/114.3 |
| 2006/0279359 A1 | 12/2006 | Tsutsui et al. | |

FOREIGN PATENT DOCUMENTS

| | | |
|---|---|---|
| DE | 697 20 702 T2 | 2/2004 |
| EP | 0 813 294 A2 | 12/1997 |
| JP | 5122087 A | 5/1993 |
| JP | 2000183763 A | 6/2000 |
| JP | 2001230684 A | 8/2001 |
| WO | 03073627 A1 | 9/2003 |

* cited by examiner

*Primary Examiner* — Lee Nguyen
(74) *Attorney, Agent, or Firm* — Eschweiler & Associates, LLC

(57) ABSTRACT

A circuit arrangement includes a signal processing unit and a regulation unit. The signal processing unit processes an input signal to form an analog output signal. The regulation unit is coupled to the signal processing unit in order to produce a digital regulation signal as a function of the analog output signal for regulation of the analog output signal.

13 Claims, 5 Drawing Sheets

US 8,116,701 B2

CIRCUIT ARRANGEMENT AND METHOD FOR SETTING AN ANALOG OUTPUT SIGNAL

REFERENCE TO RELATED APPLICATIONS

This application claims the benefit of the priority date of German application De 10 2006 035 663.2, filed Jul. 31, 2006, the contents of which are herein incorporated by reference in their entirety.

FIELD OF THE INVENTION

The present invention relates to a circuit arrangement and a related method for setting an analog output signal.

BACKGROUND OF THE INVENTION

In many transmission standards for mobile communication, such as the Global System for Mobile Communications, or GSM for short, and Enhanced Data rates over GSM Evolution, or EDGE for short, it should be possible to set the power of an analog output signal very accurately. Normally, the transmitted power is measured by a detector, is compared with a preset value, and is set precisely by means of a variable gain amplifier, or VGA for short. This is used in particular for standards such as GSM and EDGE, because of the time-slot structure for the transmissions and a ramp rise in the transmitted power. Since transmitting and receiving arrangements are increasingly being produced in digital form, complementary metal-oxide semiconductor integration technologies, or CMOS integration technologies for short, are being used, which allow variable gain amplifiers to be designed that are relatively simple.

DETAILED DESCRIPTION OF THE INVENTION

The invention will be explained in more detail in the following text using a plurality of exemplary embodiments and with reference to the figures. Components which have the same function and/or the same effect have the same reference symbols. Where circuit parts or components have corresponding functions, their description will not be repeated.

In one embodiment, a circuit arrangement comprises a signal processing unit for processing an input signal to form an analog output signal, and a regulation unit which is coupled to the signal processing unit in order to produce a digital regulation signal as a function of the analog output signal for regulation of the analog output signal.

In another embodiment, a circuit arrangement comprises a signal processing unit for processing an input signal to form an analog output signal, and a regulation unit which is coupled to the signal processing unit, which comprises circuit for producing a ramp signal, in order to produce a digital regulation signal as a function of the ramp signal for controlling the analog output signal.

In one embodiment, a method for setting an analog output signal comprises producing a digital regulation signal as a function of an analog output signal. Furthermore, an input signal is processed to form the analog output signal as a function of the digital regulation signal.

Figure 1:
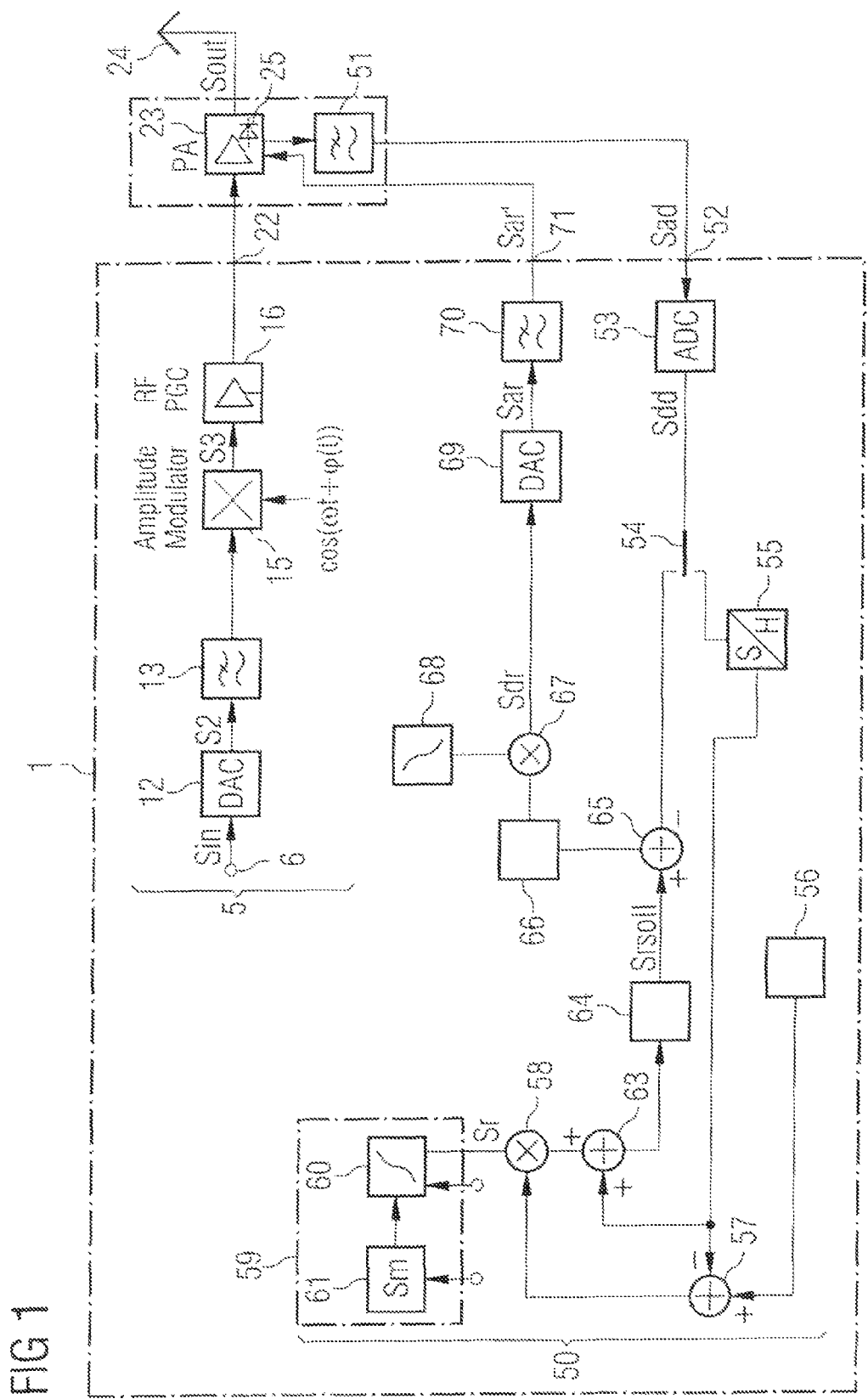
FIG. 1 is a block diagram illustrating one exemplary embodiment of a circuit arrangement.

FIG. 1 shows one exemplary embodiment of a circuit arrangement 1, which comprises a signal processing unit 5 and a regulation unit 50. The signal processing unit 5 comprises a signal input 6, a further digital/analog converter 12 following the signal input 6, a first filter 13 following the further digital/analog converter 12, a modulator 15 following the first filter 13, an amplifier 16 following the modulator 15, and a power amplifier 23 following the amplifier 16. The output side of the power amplifier 23 is connected to an antenna 24. The power amplifier 23 is coupled to a detector 25. The detector 25 is connected via a second filter 51 to a detector signal input 52 of the circuit arrangement 1.

The regulation unit 50 has an analog/digital converter 53, a further changeover switching circuit 54, a comparison circuit 65, a sample-and-hold circuit 55, a preset value input 56, a further comparison circuit 57, a circuit for producing a ramp signal 59, a further multiplication circuit 58, an adding circuit 63, a sampling rate increaser 64, a circuit for setting a control loop 66, a circuit for producing a downward ramp signal 68, a digital/analog converter 69 and a third filter 70. The detector 25 is connected via the detector signal input 52 to the analog/digital converter 53. One input of the further changeover switching circuit 54 is connected to an output of the analog/digital converter 53. A first output of the further changeover switching circuit 54 is connected via the sample-and-hold circuit 55 to an inverting input of the further comparison circuit 57. A second output of the further changeover switching circuit 54 is connected to the comparison circuit 65. A non-inverting input of the further comparison circuit 57 is connected to the preset value input 56. The circuit for setting a control loop 66 comprises an integrating amplifier.

The circuit for producing a ramp signal 59 comprises a memory 61 and a signal output circuit 60. The memory 61 is coupled via the signal output circuit 60 to one output of the circuit for producing a ramp signal 69. The signal output circuit 60 comprises a filter. The output of the circuit for producing a ramp signal 59 and one output of the further comparison circuit 57 are connected to two inputs of the further multiplication circuit 58. The output side of the further multiplication circuit 58 is connected to one input of the adding circuit 63. A further input of the adding circuit 63 is connected to the output of the sample-and-hold circuit 55. The sampling rate increaser 64 is connected to one output of the adding circuit 63. The output side of the sampling rate increaser 64 is connected to a non-inverting input of the comparison circuit 65. An inverting input of the comparison circuit 65 is connected to a second output of the further changeover switching circuit 54. One output of the comparison circuit 65 is connected via the circuit for setting a control loop 66 to the additional multiplication circuit 67. The circuit for producing a downward ramp signal 68 is connected to a further input of the additional multiplication circuit 67. One output of the additional multiplication circuit 67 is linked to one input of the digital/analog converter 69. The output of the digital/analog converter 69 is connected via the third filter 70 and the output 71 to a control input of the power amplifier 23.

An input signal Sin is supplied to the signal input 6 of the signal processing unit 5 and is transformed by means of the further digital/analog converter 12 to an analog signal S2. The analog signal S2 is filtered via a first filter 13 and is transformed by means of the modulator 15, which is in the form of an amplitude modulator in one embodiment, to a modulated signal S3, which is in the form of a radio-frequency signal. The analog signal S3 is passed to the amplifier 16. The amplifier 16 is in the form of a radio-frequency amplifier with a programmable gain. The signal that has been amplified in this way is passed via one connection 22 of the circuit arrangement 1 to the power amplifier 23, on whose output side the analog output signal Sout is produced, and is fed to the antenna 24 for transmission.

As a function of the analog output signal Sout, the detector 25 produces a signal which, after filtering by means of the second filter 51, is passed in the form of an analog detector signal Sad to the detector signal input 52 of the circuit arrangement 1, to be precise to the analog/digital converter 53. The analog/digital converter 53 converts the analog detector signal Sad to a digital detector signal Sdd. The analog/digital converter 53 is in the form of a high-speed analog/digital converter. The digital detector signal Sdd is passed via the further changeover switching circuit 54 to the sample-and-hold circuit 55 in a first operating mode, and is passed to the inverting input of the comparison circuit 65 in a second operating mode. The signal which is produced at the output of the sample-and-hold circuit 55 is compared by means of the further comparison circuit 57 with a preset value which is applied to the preset value input 56.

The output side of the circuit for producing a ramp signal 59 emits a ramp signal Sr which is multiplied by means of the further multiplication circuit 68 by the signal at the output of the further comparison circuit 57. The ramp signal Sr, in one embodiment, is generated by means of the values stored in the memory 61 and the signal output circuit 60. The signal output circuit 60 filters the values stored in the memory 61. The ramp signal Sr covers values between 0 and 1. The adding circuit 63 adds the signal at the output of the sample-and-hold circuit 55 to the signal at the output of the further multiplication circuit 58. The signal produced by the adding circuit 63 in this way is passed as a reference value Srnom via the sampling rate increaser 64 to the non-inverting input of the comparison circuit 65, and is compared by the comparison circuit 65 with the digital detector signal Sdd as an actual value in the second operating mode. A comparison result is passed via the circuit for setting a control loop 66 to one input of the additional multiplication circuit 67. A signal from the circuit for producing a downward ramp 68 is passed to a further input of the additional multiplication circuit 67.

When ramping up, the value 1 is produced at the output of the circuit for producing a downward ramp signal 68. The circuit for producing a downward ramp signal 68 emits a signal with values between 0 and 1, in one embodiment, in order to reduce the transmitted power at the end of a time slot, with the values being emitted in a falling sequence. A digital regulation signal Sdr obtained by means of the additional multiplication circuit 67 is passed via the digital/analog converter 69 and the third filter 70 to one output 71 of the regulation unit 50.

The power amplifier 23 has a control input to which the analog regulation signal Sar produced at the output 71 of the regulation unit 50 is supplied. The control input may be in the form of a bias input in one embodiment.

In one embodiment, the regulation unit 50 advantageously carries out the following functions: the analog detector signal Sad produced by means of the detector 25 and the second filter 51 is digitized and compared with a reference value Srnom, with the reference value Srnom being determined as a function of the ramp signal Sr. A digital regulation signal Sdr is generated from the comparison result and is passed via the digital/analog converter 69 to the power amplifier 23.

In one embodiment, since the analog detector signal Sad may already have an offset value, even if the power amplifier 23 is producing a power level of 0 watts, a first value of the analog detector signal Sad or of the digital detector signal Sdd is stored in the sample-and-hold circuit 55 at the start of a time slot. During operation, the further changeover switching circuit 54 is thus operated such that the further changeover switching circuit 54 first of all passes the digital detector signal Sdd to the sample-and-hold circuit 55, before the further changeover switching circuit 54 subsequently supplies the following values of the digital detector signal Sdd to the comparison circuit 65. The reference signal Srnom is therefore formed as a function of an offset value and of the ramp signal Sr.

In one embodiment, the third filter 70 is in the form of a first-order filter with a cut-off frequency of 1.2 Megahertz.

A circuit arrangement as shown in FIG. 1 may be used in a power regulator, or automatic power control, or APC for short, in particular for the GMSK data modulation method which is used for the GSM Standard.

In one alternative embodiment, the circuit for setting a control loop 66 may comprise a proportional regulator, a proportional, integrating regulator or a proportional, integrating, differentiating regulator, or P regulator, PI regulator, PID regulator for short.

Figure 2:
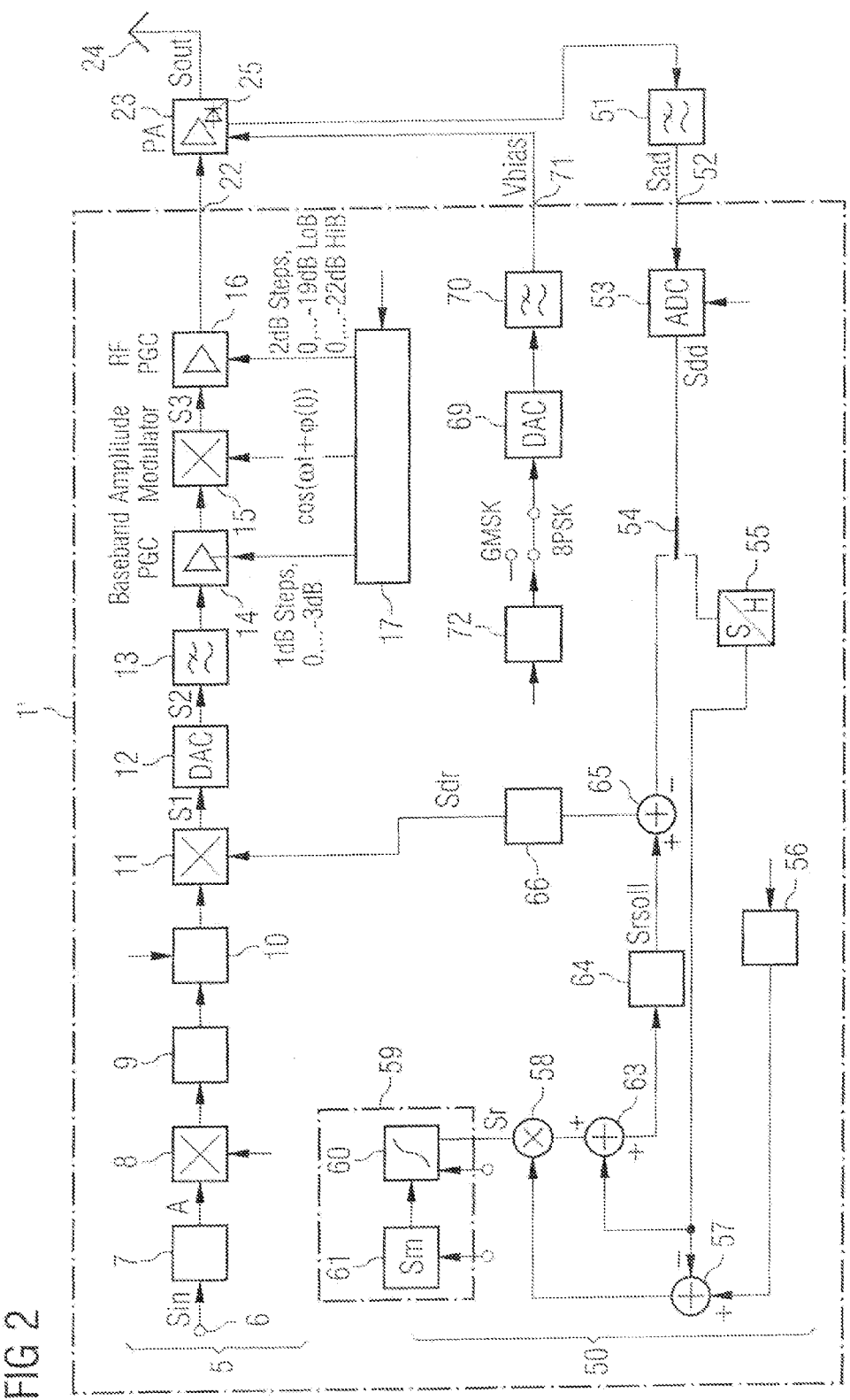
FIG. 2 is a block diagram illustrating a further exemplary embodiment of a circuit arrangement according to the invention, with a multiplication circuit in a signal processing unit.

FIG. 2 shows a further exemplary embodiment of a circuit arrangement 1' according to the invention, which is a development of the circuit arrangement 1 shown in FIG. 1. The signal processing unit 5 as shown in FIG. 2 comprises the signal input 6, a coordinate transformation circuit 7, a level multiplication circuit 8, a further sampling rate increaser 9, a delay circuit 10, a multiplication circuit 11, a digital/analog converter 12, a first filter 13, a baseband amplifier 14, the modulator 15 and the amplifier 16, which are all connected in series, in one embodiment. The amplifier 16 is connected via the connection 22 to the power amplifier 23. The multiplication circuit 11 comprises a multiplier with an input and a control input.

Large parts of the regulation unit 50 shown in FIG. 2 are designed in the same way as the regulation unit 50 shown in FIG. 1. In contrast to the regulation unit 50 shown in FIG. 1, the output of the comparison circuit 69 in the regulation unit 50 shown in FIG. 2 is connected via the circuit for setting a control loop 66 to a control input of the multiplication circuit 11. Furthermore, the regulation unit 50 provides an amplifier control unit 17 which is coupled to the baseband amplifier 14, to the modulator 15 and to the amplifier 16. Furthermore, the regulation unit 50 has a reference-value transmitter 72, whose output side is coupled via the digital/analog converter 69 and the third filter 70 to the control input of the power amplifier 23.

The digital regulation signal Sdr which is produced on the output side of the circuit for setting a control loop 66 is passed, according to the circuit arrangement 1' in FIG. 2, to the control input of the multiplication circuit 11 in the signal processing unit 5. The signal processing unit 5 is therefore influenced on the digital side and not on the analog side, as in the case of the signal processing unit 5 shown in FIG. 1.

The baseband amplifier 14 is in the form of a programmable gain baseband amplifier. The gain can be varied between 0 and minus 3 dB in 1 dB steps. In one embodiment, the amplifier 16 has been designed as a variable gain radio-frequency amplifier which, depending on the operating mode, has a gain of between 0 and minus 19 dB, or between 0 and minus 22 dB, in steps 2 dB. The reference-value transmitter 72 is supplied with a 2-bit signal so that a bias signal Vbias is produced at the output of the third filter 70 and has a value out of four variable values in one embodiment. Three control signals are applied to the analog/digital converter 53, which is in the form of a high-speed analog/digital converter. An 8-bit signal is passed to the preset value input 56.

As shown in FIG. 2, the analog output signal Sout is regulated by supplying the digital regulation signal Sdr to the multiplication circuit 11, which is used on the digital side of the signal processing unit 5.

A circuit arrangement as shown in FIG. 2 can be used in a power regulator in particular for the 8-PSK data modulation method which is used for the EDGE Standard.

Figure 3A:
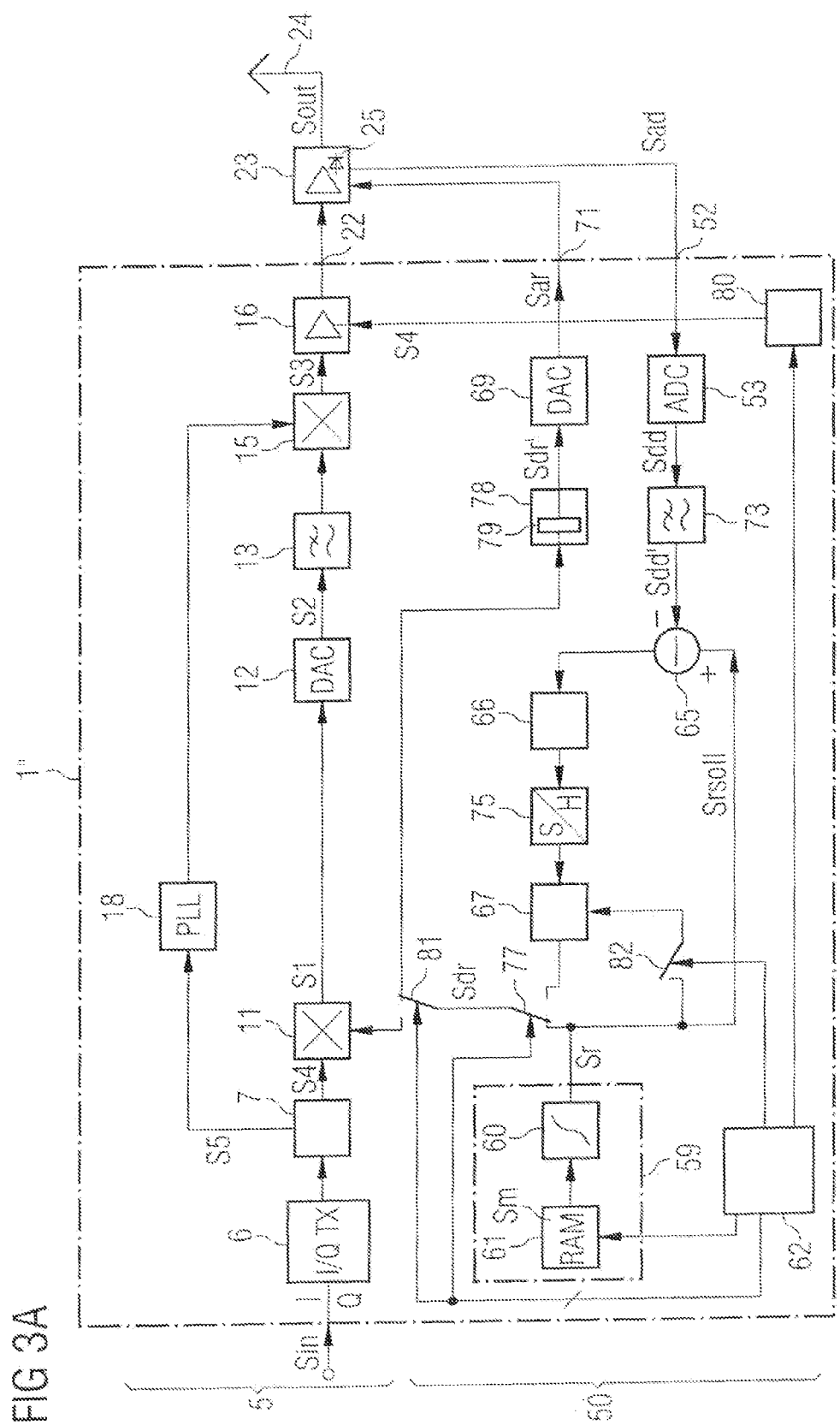
FIGS. 3A and 3B are block diagrams illustrating further exemplary embodiments of a circuit arrangement according to the invention, which have changeover switches for switching between different operating modes.

FIG. 3A shows another exemplary embodiment of a circuit arrangement 1" according to the invention, which has a signal processing unit 5 and a regulation unit 50. The signal processing unit 5 comprises a signal input 6 which is followed by a coordinate transformation circuit 7, or Cordic. The coordination transformation circuit 7 is connected via a multiplication circuit 11 to a further digital/analog converter 12. The output side of the further digital/analog converter 12 is coupled by means of a first filter 13 to one input of the modulator 16. The first filter 13 is in the form of a low-pass filter. The coordinate transformation circuit 7 is connected by a further output to one input of a phase locked loop 18. The output side of the phase locked loop 18 is connected to a further input of the modulator 15. The output side of the modulator 15 is connected to an amplifier 16, whose output is connected to the connection 22 of the signal processing unit 5". The input side of a power amplifier 23 is connected to the connection 22, and its output side is coupled to an antenna 24.

The regulation unit 50 has circuit for producing a ramp signal 59, one output of which circuit is connected to a first input of a further changeover switch 77.

The output of the circuit for producing a ramp signal 59 is likewise connected to a non-inverting input of a comparison circuit 65. A detector 25 is coupled to the power amplifier 23. The detector 25 may be in the form of a peak value detector in one embodiment. The output side of the detector 25 is connected via a detector signal input 52 of the regulation unit 50 to an analog/digital converter 53 for the regulation unit 50. The analog/digital converter 53 is coupled via a fourth filter 73 to an inverting input of the comparison circuit 65. The fourth filter 73 is in the form of a low-pass filter. The output side of the comparison circuit 65 is coupled via a circuit for setting a control loop 66, a sample-and-hold circuit 75 and an additional multiplication circuit 67 to a second input of the further changeover switch 77.

One output of the further changeover switch 77 is connected to one input of the changeover switch 81.

A first output of the changeover switch 81 is connected to a control input of the multiplication circuit 11. A second output of the changeover switch 81 is connected via an interpolation circuit 78 and a digital/analog converter 69 to one output 71 of the regulation unit 50. The interpolation circuit 78 has a memory 79 in the form of a table memory. A control input of the power amplifier 23 is connected to the output 71 of the regulation unit 50.

The circuit for producing a ramp signal 59 has a memory 61 and a signal output circuit 60. The input side of the signal output circuit 60 is connected to the memory 61, and its output side is connected to the output of the circuit for producing a ramp signal 59. The output of the circuit for producing a ramp signal 59 is connected via a switch 82 to a further input of the additional multiplication circuit 67.

Furthermore, the regulation unit 50 has a register 80 whose output side is connected to a control input of the amplifier 16. The output side of a control unit 62 is connected to the circuit for producing a ramp signal 59, to the register 80, to the further changeover switch 77, to the changeover switch 81 and to the switch 82.

An input signal Sin is passed to the signal input 6 of the signal processing unit 5, and is split into an in-phase signal I and a quadrature signal Q. The input signal Sin is converted by means of the coordinate transformation circuit 7 to an amplitude signal and a phase signal. A carrier signal is produced by the phase locked loop 18. The carrier signal is generated as a function of the phase signal which is supplied to the phase locked loop 18. The amplitude signal is multiplied by a signal applied to the further input of the multiplication circuit 11, and is then converted to an analog signal S2 by the further digital/analog converter 12. The further input of the multiplication circuit 11 is also referred to as the control input. The analog signal S2 is filtered by means of the first filter 13 and is supplied to the modulator 15. A modulated signal S3 which is produced on the output side of the modulator 15 is amplified by the amplifier 16 as a function of a control signal S4 applied to the control input of the amplifier 16, and is emitted to the connection 22 of the signal processing unit 5. The amplifier 16 may, for example, have gains of 0 dB to 42 dB, which can be adjusted in steps of 1 dB in one embodiment. The power amplifier 23 amplifies the signal at the connection 22 of the signal processing unit 5, and supplies the amplified analog output signal Sout is the antenna 24.

A ramp signal Sr which is produced on the output side of the circuit for producing a ramp signal 59 can be passed in a first operating mode via the further changeover switch 77 and the changeover switch 81 to the further input of the multiplication circuit 11. A constant value is supplied to the control input of the power amplifier 23 during a time slot. In the first operating mode, the digital regulation signal Sdr is therefore the same as the ramp signal Sr. In the first operating mode, the circuit arrangement is therefore operated without regulation, as an open loop, and the signal processing unit 5 is influenced via the multiplication circuit 11. This can be used, for example, for the S-PSK data modulation method, which is used for the EDGE Standard.

In a second operating mode, the ramp signal Sr is passed to the non-inverting input of the comparison circuit 65. An analog detector signal Sad produced by the detector 25 is passed via the detector signal input 52 to the analog/digital converter 53. The digital detector signal Sdd produced by the analog/digital converter 53 is filtered by means of the fourth filter 73, and is passed to the inverting input of the comparison circuit 65. A signal which is produced at one output of the comparison circuit 65 and represents the comparison result is amplified by the circuit for setting a control loop 66, is passed in a first form of the signal operating mode through the sample-and-hold circuit 75 and the additional multiplication circuit 67, and is passed via the further changeover switch 77 and the changeover switch 81 as a digital regulation signal Sdr to the further input of the multiplication circuit 11. In a second form of the second operating mode, the amplified signal is not passed through the sample-and-hold circuit 75, but an amplified signal produced at a previous time is produced on the output side of the sample-and-hold circuit 75. The digital regulation signal Sdr therefore remains at a second value in the second form of this operating mode. The first form of this operating mode can be used at the start of a time slot, and the second form of the operating mode can be used for the majority of the time of the time slot, specifically for the time during which the payload signal is being transmitted. A constant value is supplied to the control input of the power amplifier 23 throughout the time slot. In the second operating mode, the circuit arrangement 1" is thus operating with regulation, that is to say in the form of a closed loop, and the signal processing unit 5 is likewise influenced by the multiplication circuit 11. This can likewise be used, for example, for the 8-PSK data modulation method for the EDGE Standard.

In a third operating mode, the ramp signal Sr can be supplied to the power amplifier 23 as a digital regulation signal Sdr via the further changeover switch 77, the changeover switch 81, the interpolation circuit 78 and the digital/analog converter 69. In this case, a value is read from the memory 79 as a function of the digital regulation signal Sdr applied to the input of the interpolation circuit 78. The memory 79 is in the form of a table memory, that is to say a look-up table in one embodiment. Since the digital regulation signal Sdr may assume a multiplicity of values and a corresponding output value cannot be produced from the memory 79 for each value, the interpolation circuit 78 can be used in one embodiment to produce a signal Sdr' which is produced by interpolation, at the output of the interpolation circuit 78 by using adjacent output values. This signal Sdr' is converted by the digital/analog converter 69 to an analog regulation signal Sar which is passed to the control input of the power amplifier 25. In this embodiment, the power amplifier 25 has a variable gain. The power amplifier 25 is then operated in a compressed mode. A constant value is supplied to the further input of the multiplication circuit 11. The value may, for example, be 1. In the third operating mode, the circuit arrangement is therefore operated without control, that is to say in the form of an open loop, and the control is provided via the control input of the power amplifier 23. This can be used, for example, for the GMSK data modulation method for the GSM Standard.

In a fourth operating mode, the ramp signal Sr is passed to the non-inverting input of the comparison circuit 65, and the comparison result is passed via the circuit for setting a control loop 66, the sample-and-hold circuit 75 and the additional multiplication circuit 67 to the second input of the further changeover switch 77. The digital regulation signal Sdr is therefore produced at the output of the further changeover switch 77 and is passed via the changeover switch 81, the interpolation circuit 78 and the digital/analog converter 69 to the power amplifier 23. A constant value is supplied to the further input of the multiplication circuit 11. By way of example, the value may be 1. In the fourth operating mode, the circuit arrangement is therefore operated with regulation, that is to say in the form of a closed loop, and the regulation is provided via the control input of the power amplifier 23. This can likewise be used, for example, for the GMSK data modulation method for the GSM Standard.

A control signal S4 is produced on the output side of the register 80 and is passed to the control input of the amplifier 16. The amplifier 16 has a set of discrete values for its gain. A value for the gain is set in the amplifier 16 on the basis of the control signal S4. The control signal S4 is produced such that the gain of the amplifier 16 is constant during the time slot. The total gain of the signal processing unit 5 is thus set roughly by means of the amplifier 16; fine setting is carried out by the multiplication circuit 11 in the first and in the second operating mode, and by means of the power amplifier 23 in the third and the fourth operating mode.

One advantage of the embodiment of the circuit arrangement 1" is that the changeover switch 81 can be used to switch over the tapping for setting the transmitted power. In one position of the changeover switch 81, the digital regulation signal is passed to the multiplication circuit 11, and in another position of the changeover switch 81, it is passed to the control input of the power amplifier 23. The circuit arrangement 1" can therefore be used for different types of transmission and standards. A further advantage of the embodiment in the circuit arrangement 1" is that the further changeover switch 77 can be used to switch from regulated operation to unregulated operation.

The circuit arrangement shown in FIG. 3A can advantageously be used for power regulation for the GMSK data modulation method, which is used for the GSM Standard, as well as for the 8-PSK data modulation method, which is used for the EDGE Standard.

In one alternative embodiment, which is not illustrated, a signal transmitter and a switch are provided, with the switch being coupled to the further input of the multiplication circuit 11, and with a constant value being supplied to the further input when, in one position of the changeover switch 77, the digital regulation signal Sdr is not passed to the further input of the multiplication circuit. The constant value may be 1. A further signal transmitter and a further switch are likewise provided which switch is coupled to the interpolation circuit 78 and supplies a variable value to it when, with the changeover switch 77 in a different position, the digital regulation signal Sdr is not passed to the interpolation circuit 78. The variable value may assume a first value before a time slot, so that the transmitted power is 0 watts, and a second value, which is constant, throughout a time slot.

In one alternative embodiment, which is not illustrated, the interpolation circuit 78 is omitted, so that the digital regulation signal Sdr is passed directly to the digital/analog converter 69.

In one alternative embodiment, the circuit for setting a control loop 66 may comprise an amplifier, an integrator and a differentiator using digital technology to produce a PID regulator.

In one alternative embodiment, which is not illustrated, the fourth filter 73 is placed upstream of the analog/digital converter 53, rather than downstream from it.

In one alternative embodiment, which is not illustrated, a third filter 70 is connected downstream from the digital/analog converter 69 in order to reduce interference influences on the analog output signal Sout.

Figure 3B:
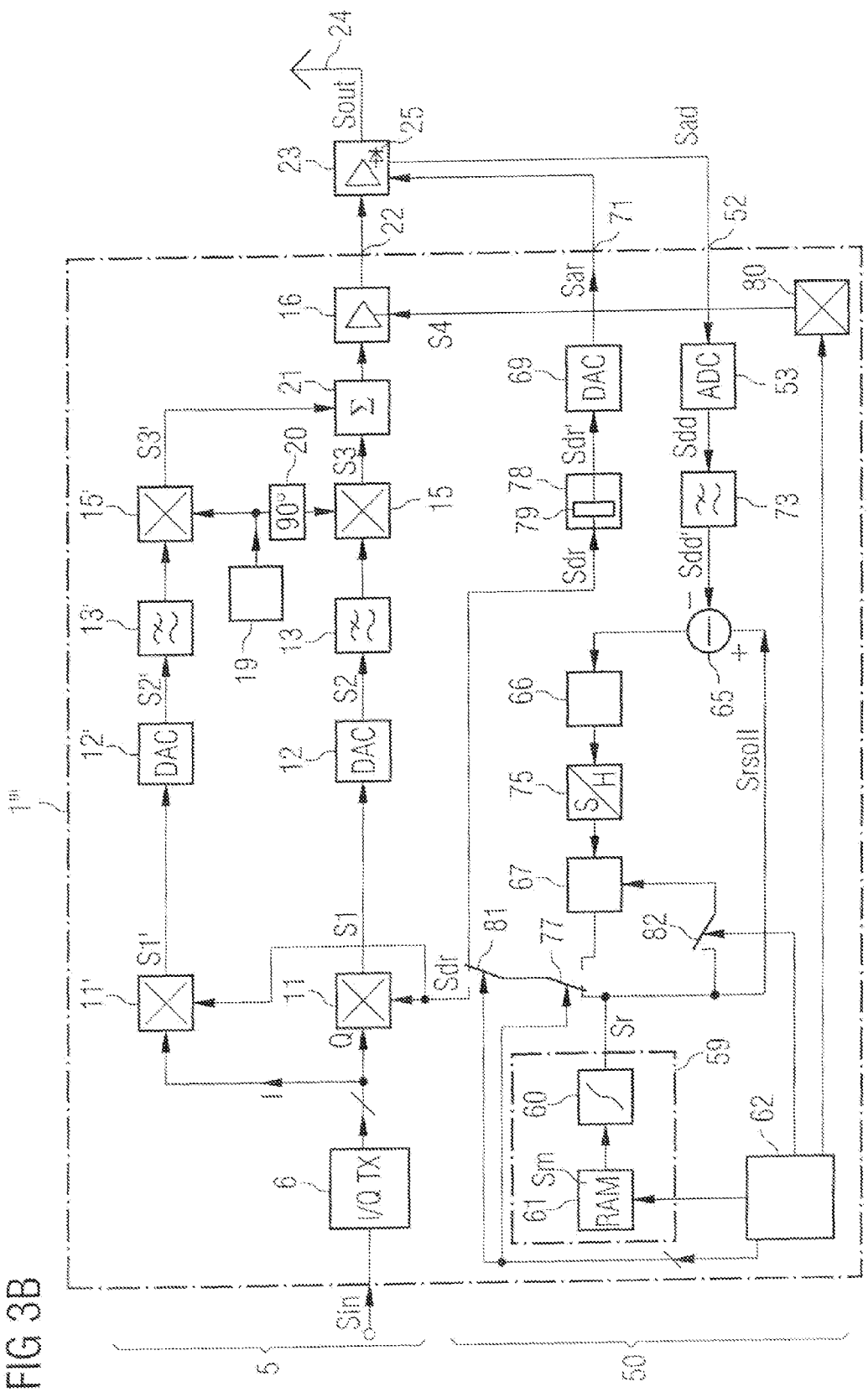

FIG. 3B shows a further exemplary embodiment of the circuit arrangement 1'" according to the invention, with this being a development of the circuit arrangement 1" shown in FIG. 3A.

The signal processing unit 5 has one path for processing an in-phase signal I, and a further path for processing a quadrature signal Q. The multiplication circuit 11 and a further multiplication circuit 11' are connected to the signal input 6 of the signal processing unit 5. The further multiplication circuit 11' is connected at a further input to the further input of the multiplication circuit 11. The output side of the further multiplication circuit 11' is connected to a further digital/analog converter 12'. This is in turn connected via a further filter 13' to the further modulator 15'. The further filter 13' is in the form of a low-pass filter. The further modulator 15' is connected directly to one output of a carrier frequency generator 19, and the modulator 15 is connected via a 90 degree phase shifter 20 to this output of a carrier frequency generator 19. The output sides of the modulator 15 and of the further modulator 15' are connected to a summation circuit 21, whose output side is in turn connected to the amplifier 16. The amplifier 16 is in turn connected to the power amplifier 23.

The regulation unit 50 corresponds to the regulation unit 50 in FIG. 3A. In addition, the first output of the changeover switch 81, which is connected to the further input of the multiplication circuit 11, is also connected to the further input of the further multiplication circuit 11' in order to supply the digital regulation signal Sdr.

The signal processing unit 5 is intended to separately process the in-phase signal I and the quadrature signal Q applied to the signal input 6 of the signal processing unit 5.

In the first and the second operating mode, the two signals I, Q are multiplied by the same digital regulation signal Sdr, are then converted to a respective analog signal, and are filtered by means of the first filter or the further filter 13, 13'. A carrier signal which has been produced by the carrier frequency generator 36 is supplied to the modulator 15 with a 90-degree phase shift, and to the further modulator 15'. A signal at the output of the modulator 15 and a signal at the output of the further modulator 15' are combined by means of the summation circuit 21 and are passed to the input of the amplifier 16.

In the third and the fourth operating mode, the power of the analog output signal Sout is set via the control input of the power amplifier 23.

The transmitted power can also advantageously be set accurately for processing of the in-phase signal and of the quadrature signal I, Q by the two signals I, Q being separately multiplied by the same digital regulation signal Sdr, or the precise setting of the transmitted power in the power amplifier 23.

The circuit arrangement 1''' shown in FIG. 3B can be used for power regulation for the GMSK data modulation method, which is used for the GSM Standard, and for the 8-PSK data modulation method, which is used for the EDGE Standard.

Figure 4A:
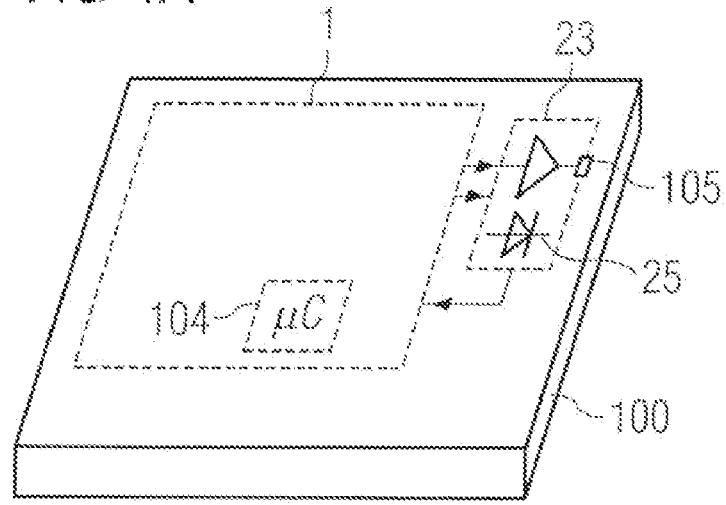
FIGS. 4A and 4B are perspective views illustrating exemplary embodiments of one and two semiconductor bodies, respectively, which comprise the circuit arrangement and the power amplifier, according to the invention.
Figure 4B:
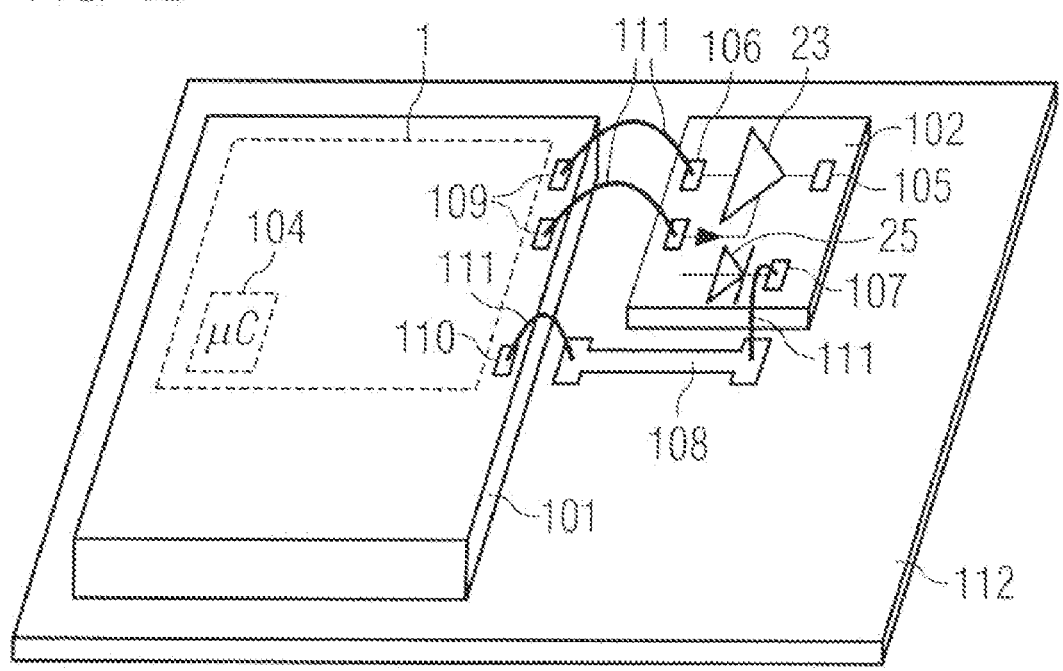

FIGS. 4A and 4B show exemplary embodiments of one semiconductor body and two semiconductor bodies, respectively, which comprise the circuit arrangement 1 and the power amplifier 23, according to one embodiment of the invention.

FIG. 4A shows an exemplary embodiment of a first semiconductor body 100, which comprises the circuit arrangement 1 together with the power amplifier 23 and the detector 25. The circuit arrangement 1 has digital gates and analog circuits. The circuit arrangement 1 is coupled to the power amplifier 23 and to the detector 25. The output side of the power amplifier 23 has a connection 105 to which the antenna 24, which is not shown, can be coupled. The circuit arrangement 1, the power amplifier 23 and the detector are produced using integrated semiconductor technology. The semiconductor body 100 is formed from a silicon substrate.

It is advantageous for integration on the semiconductor body 100 for the connecting paths to be kept short, for the external connections to be reduced, and for the area of the semiconductor body 100 to be kept small.

In one alternative embodiment, the circuit arrangement 1 has a microcontroller 104, which is indicated by dots in FIG. 4A.

Alternatively, the semiconductor body 100 has a substrate composed of gallium arsenide, GaAs for short a silicon-germanium, SiGe for short.

In one alternative embodiment, which is not illustrated, the detector 25 is coupled to the antenna 24 and is not provided on the semiconductor body 100.

FIG. 4B shows a further exemplary embodiment with a first and a second semiconductor body 101, 102. The first semiconductor body 101 has the circuit arrangement 1, which comprises analog circuits and digital gates, as well as connections 109, 110. The second semiconductor body 102 has the power amplifier 23 as well as the detector 25 and connections 105, 106, 107. The input side of the power amplifier 23 is connected via the connections 106, which are located on the second semiconductor body 102, to the connections 109, which are located on the first semiconductor body 101, and are used to make contact with the circuit arrangement 1. Bonding wires are provided for connection purposes. The output side of the power amplifier 23 can be coupled via the connection 105 to the antenna 24, which is not illustrated. The detector 25 is connected via a connection 107 on the second semiconductor body 102 to a connection 110 on the first semiconductor body 101. The connections 107 and 110 are connected to one another by means of two bonding wires 111 and an interconnect 108. The first and the second semiconductor bodies 101, 102 are formed on a mount 112.

In one embodiment the circuit arrangement 1 together with the microcontroller 104 is produced on the first semiconductor body 101 using CMOS integration technology. The power amplifier 23 and the detector 25 are produced on the second semiconductor body 102 using power transistor technology.

The separation into a first and a second semiconductor body 101, 102 advantageously makes it possible to use a respectively specialized production technique for the circuit part.

In one alternative embodiment, the circuit arrangement 1 has a microcontroller 104, which is indicated by dots in FIG. 4B.

In one alternative embodiment, which is not illustrated, the detector 25 is coupled to the antenna 24 and is not formed on the second semiconductor body 102.

In one alternative embodiment, which is not illustrated, flipchip technology can be used as the construction and connection technique for the two semiconductor bodies 101, 102.

According to one embodiment, a circuit arrangement comprises a signal processing unit and a regulation unit. The signal processing unit and the regulation unit are connected to one another. An input signal is passed to the signal processing unit. An analog output signal can be tapped off from the output side of the signal processing unit. The signal processing unit produces the analog output signal as a function of the input signal. A digital regulation signal can be tapped off from the output side of the regulation unit, and is used to regulate the analog output signal. The digital regulation signal is produced by the regulation unit as a function of the analog output signal.

One advantage of the circuit arrangement is that the regulation unit is provided with information about the analog output signal by being coupled to the signal processing unit, with the regulation unit using this information to generate the digital regulation signal. The use of digital circuit parts to produce the digital regulation signal in one embodiment allows very precise regulation, which can be matched to different data modulation methods, for the analog output signal level, and therefore of the transmitted power. The power of an analog output signal can advantageously be set precisely.

The input signal may be an analog input signal. The input signal is a digital input signal in one embodiment.

In one embodiment, the signal processing unit comprises a multiplication circuit. The regulation unit supplies the digital regulation signal to a control input of the multiplication circuit.

The multiplication circuit can be realized by a multiplier.

In one embodiment, the circuit arrangement comprises a digital/analog converter which converts the digital regulation signal to an analog regulation signal. One advantage of this embodiment is that the analog regulation signal is used to supply an analog regulation signal to an analog circuit part in the circuit arrangement, and that the analog circuit part can be set by means of the analog regulation signal.

The analog output signal can be produced by the signal processing unit as a function of the input signal and of the digital regulation signal.

In one embodiment, the regulation unit has a circuit for producing a ramp signal. The regulation unit can thus emit the digital regulation signal using the ramp signal.

In one embodiment, the circuit for producing a ramp signal has a memory. The memory stores values by means of which the shape of the ramp signal can be set. The memory may be in the form of a table memory. In order to increase the transmitted power, the values or some of the values in the memory can be processed in a rising sequence. The values or some of the values can be used in a falling sequence in order to reduce the transmitted power. The ramp signal may be a signal which rises approximately linearly as a function of time from a lower value to an upper value. The ramp signal Sr in one embodiment is a signal which approximately becomes greater as a function of time t from a lower value to an upper value in accordance with:

$$Sr \propto 1-\cos(\alpha-t),$$

where $\alpha*t$ assumes values between 0 and $\pi$.

In one embodiment, after reaching the upper value, the ramp signal can remain at the upper value for a variable time, before it is switched back to the lower value. In one embodiment, the ramp signal remains at the lower value until a pulse is supplied to the circuit for producing the ramp signal, thus initiating the linear rise of the ramp signal.

In one embodiment, the signal processing unit comprises a power amplifier to which an antenna can be coupled, and which produces the analog output signal to be fed to the antenna.

In one embodiment, the power amplifier has a detector from whose output side an analog detector signal can be tapped off. One output of the detector is connected to a detector signal input of the regulation unit. One advantage of this embodiment is that the detector allows the transmitted power to be detected.

The detector may be in the form of a peak-value detector or an envelope-curve detector in one embodiment, and can determine a level from the analog signal applied to the input side of the power amplifier or from the analog output signal produced on the output side of the power amplifier. This level is a measure of the transmitted power. The transmitted power may be approximately proportional to the square of this level. Alternatively, the power amplifier may have a directional coupler as the detector, from which an analog detector signal can be tapped off.

In one embodiment, the circuit arrangement has an analog/digital converter, whose input side is connected via the detector signal input to the output of the detector, and which is provided for digitizing the analog detector signal to form a digital detector signal.

In one embodiment, the regulation unit has a comparison circuit. The comparison circuit has a first and a second input as well as an output. The first input of the comparison circuit is coupled to the circuit for producing a ramp signal, and the second input is coupled to the detector. The ramp signal or a signal derived from the ramp signal is supplied to the first input of the comparison circuit, and the digital detector signal or a signal derived from the digital detector signal is supplied to the second input of the comparison circuit.

In one embodiment, the signal processing unit comprises a multiplication circuit, a further digital/analog converter, a modulator and an amplifier. The output side of the multiplication circuit is coupled to the further digital/analog converter. The output side of the further digital/analog converter is coupled to the modulator, which is in turn connected to an input of the amplifier. An output of the amplifier is connected to the power amplifier.

In one embodiment, the output side of the circuit for producing a ramp signal can be coupled via the comparison circuit to a further input of the multiplication circuit. The further input of the multiplication circuit is also referred to as a control input of the multiplication circuit. The input signal or a signal derived from it, as well as the digital regulation signal, are supplied to the multiplication circuit. A multiplied signal can be tapped off from the output side of the multiplication circuit and is converted to an analog signal by means of the further digital/analog converter. The analog signal is modulated by means of the modulator, is amplified by means of the amplifier and the power amplifier, and is produced by the power amplifier as the analog output signal. On advantage of this embodiment is that the multiplication circuit allows the power of the analog output signal to be set precisely without any need for an amplifier or a power amplifier with linear gain control. The multiplication circuit advantageously allow the transmitted power to be set with fine resolution.

Once the transmitted power has been set, that is to say the digital regulation signal has stabilized approximately at a value, then the digital regulation signal is advantageously kept constant while data is being transmitted so that feedback of the transmitted power that is produced to the digital regulation signal does not reduce or cancel out amplitude information in the analog output signal during the conversion of the input signal to the analog output signal.

In one alternative embodiment, the circuit for producing a ramp signal is connected via the comparison circuit to the digital/analog converter, and the digital/analog converter is connected to a control input of the power amplifier. The digital regulation signal or a signal derived from it is thus passed to the digital/analog converter, from whose output side the analog regulation signal can be tapped off. The analog regulation signal or a signal derived from it is passed to a control input of the power amplifier. According to the alternative embodiment, the regulation process is not carried out by supplying the digital regulation signal to the multiplication circuit, but by setting the power amplifier. The power amplifier can be set by varying the bias voltage to the power amplifier.

In one embodiment, the regulation unit comprises a changeover switching circuit, one input of which is connected to the comparison circuit, a first output of which is coupled to the control input of the multiplication circuit, and a second output of which is coupled to the digital/analog converter. The digital regulation signal can therefore optionally be supplied to the control input of the multiplication circuit or via the digital/analog converter to the control input of the power amplifier. If the digital regulation signal is supplied to the control input of the multiplication circuit in a first switch position, then a variable value is passed to the control input of the power amplifier. If, in contrast, the digital regulation signal is passed via the digital/analog converter to the control input of the power amplifier in a second switch position, then a further variable value is supplied to the control input of the multiplication circuit, for example the value 1.

The power amplifier can be controlled by a voltage at the control input of the power amplifier.

In one embodiment, the power amplifier comprises a variable gain. The voltage at the control input sets the gain.

In one embodiment, the power amplifier comprises a control input in the form of a bias input. The power amplifier can be controlled by a bias voltage which is provided to the control input of the power amplifier. The bias voltage may control the clipping threshold of the power amplifier.

In one embodiment, a circuit arrangement comprises a signal processing unit and a regulation unit which is coupled to the signal processing unit and has a circuit for producing a ramp signal. The signal processing unit is provided in order to process an input signal to form an analog output signal. The regulation unit produces a digital regulation unit as a function of the ramp signal for controlling the analog output signal. According to this embodiment, the analog output signal power level is subject to open-loop control, but not closed-loop control.

In one embodiment, the signal processing unit comprises a multiplication circuit, and the circuit for producing a ramp signal is coupled to a control input of the multiplication circuit. In an alternative embodiment, the circuit for producing a ramp signal is coupled via the digital/analog converter to the control input of the power amplifier. In another embodiment, a changeover switching circuit is provided, so that the circuit for producing a ramp signal is optionally coupled to the control input of the multiplication circuit or via the digital/analog converter to the control input of the power amplifier.

The signal processing unit may be designed to transmit a signal which is split into amplitude and phase information. In an alternative embodiment, the signal processing unit may be designed to process an in-phase signal and a quadrature signal.

In one embodiment, the circuit arrangement comprises individual digital circuits in order to provide different parts of the signal processing unit and of the regulation unit. In particular, the circuit for producing a ramp signal, the comparison circuit and the multiplication circuit may each be formed by means of a digital circuit. Digital circuits such as these can also be referred to as digital gates or dedicated logic and may comprise logic gates, in particular NAND gates or NOR gates, and flipflops.

In an alternative embodiment the circuit arrangement may comprise a microcontroller which, using a computer program, provides a ramp signal, the comparison circuit and further digital parts of the circuit arrangement, in particular of the regulation unit. In one embodiment, the circuit arrangement may comprise a state machine, which is used to produce a ramp signal, the comparison circuit and further digital parts of the circuit arrangement, in particular of the regulation unit.

In one embodiment, the circuit arrangement may comprise a digital signal processor, or DSP for short, by means of which a further computer program is used to provide the digital parts of the signal processing unit.

In one embodiment, a semiconductor body comprises the circuit unit with the signal processing unit, the regulation unit and the power amplifier. In one embodiment, the semiconductor body is formed by means of a semiconductor integration technology. The semiconductor integration technology may be a bipolar integration technology. The semiconductor integration technology is, in one embodiment, a CMOS integration technology. The semiconductor integration technology may be a bipolar complementary metal-oxide semiconductor integration technology, or BiCMOS integration technology for short.

In another embodiment, the circuit arrangement is provided by means of a first and a second semiconductor body. In this case, the first semiconductor body comprises the regulation unit and parts of the signal processing unit, in particular the further digital/analog converter, the modulator and the amplifier. The first semiconductor body is designed using a semiconductor integration technology. The semiconductor integration technology may be a BiCMOS integration technology. The semiconductor integration technology is preferably a CMOS integration technology. The second semiconductor body comprises the power amplifier. The second semiconductor body is designed using semiconductor technology. The second semiconductor body is preferably designed using power transistor technology. A method for producing a circuit arrangement therefore comprises the use of semiconductor integration technology, which is preferably CMOS integration technology for processing the first semiconductor body, the processing of the second semiconductor body and the connection of the first and of the second semiconductor body.

In one embodiment the circuit arrangement may be used in a mobile or stationary system for radio communication. In particular, the circuit arrangement may be used for the Gaussian-filtered minimum-shift keying communication data modulation method, or GMSK for short, as is used for the GSM Standard, and for the 8-level phase shift keying data modulation method, or 8-PSK for short, which is used for the EDGE Standard.

According to one embodiment, a method for setting an analog output signal comprises emitting a digital regulation signal that is a function of an analog output signal. An input signal is converted to the analog output signal, wherein the conversion process is carried out as a function of the digital regulation signal. An analog output signal level and therefore a transmitted power are thus advantageously set precisely by means of a regulation unit, part of which makes use of digital technology.

The input signal is a digital input signal in one embodiment.

In one embodiment, the input signal is converted to the analog output signal by the digital regulation signal first of all being converted to an analog regulation signal, and by the input signal being converted to the analog output signal as a function of the analog regulation signal.

In one embodiment, the input signal can be converted to the analog output signal in such a way that the input signal or a signal derived from it is first of all converted to an analog signal and the analog signal is filtered and modulated, so that a modulated signal is produced. The modulated signal can be amplified as a function of the analog regulation signal such as the analog output signal can be emitted.

In one alternative embodiment, an input signal is transformed to the analog output signal by the input signal or a signal derived from it being multiplied by the digital regulation signal. The multiplied signal resulting from this is converted to an analog signal, which is filtered and modulated so that a modulated signal can be emitted. The modulated signal is amplified so as to produce the analog output signal.

The digital regulation signal can be produced as a function of a ramp signal. In one development, the ramp signal is used to increase the transmitted power at the start of a transmission time slot. The increase is continued until the transmitted power is sufficient for communication. Subsequently, the digital regulation system is kept constant until the end of the communication time slot.

One embodiment provides for changeover switching between a first and a further operating mode. In the first operating mode, the digital input signal is multiplied by the digital regulation signal. In the second operating mode, an analog signal derived from the input signal is amplified as a function of the analog regulation signal.

In one embodiment, a computer program is provided for carrying out the method by means of a microcontroller.

In one embodiment, the circuit arrangement allows fine-resolution setting of the level of the output of a signal processing unit by means of a digital regulation signal.

In one embodiment, the signal processing unit may have an amplifier with discrete values for a variable gain, which can be used to increase the transmitted power in a plurality of steps. A continuously variable gain amplifier can be used, but is not necessary.

In one embodiment, the digital regulation signal can be set very precisely by comparing a digital detector signal, which is generated by means of a power-measurement detector, and a ramp signal.

In one embodiment, any influence from circuit parts or components such as the amplifier and the power amplifier on the transmitted power can be kept low since the transmitted power can be detected and readjusted as a function of the detection result. Integration technologies, in particular CMOS integration technologies, can therefore be used for a technological implementation of the transmitting arrangement which are designed for high-speed digital circuits but not for precision analog circuits.

In one embodiment, a modulator in the signal processing unit can advantageously be operated at an approximately constant output level, since the transmitted power can be set roughly in the amplifier which follows the modulator. Fine setting can preferably be provided by the multiplication circuit or by the power amplifier. The modulator level may, for example, be around a constant value within a bandwidth of + or −2 dB.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A circuit arrangement, comprising:
a signal processing unit configured to process an input signal to form an analog output signal, the signal processing unit comprising a multiplier; and
a regulation unit coupled to the signal processing unit, configured to produce a digital regulation signal based on a level of the analog output signal for regulation of the analog output signal, and supply the digital regulation signal to a control input of the multiplier, wherein the signal processing unit comprises:
a signal input configured to receive the input signal;
a further digital/analog converter having an input side coupled to the signal input;
a first filter connected downstream from the further digital/analog converter;
a modulator having an input side coupled to an output of the first filter; and
a power amplifier having an input side coupled to an output of the modulator, and configured to produce the analog output signal at an output side thereof, wherein the output side is configured to couple to an antenna,
wherein the power amplifier comprises a detector, and wherein the regulation unit further comprises an analog/digital converter, wherein an output side of the detector is coupled to the analog/digital converter, and wherein the detector is configured to supply an analog detector signal to the analog/digital converter, and wherein an output side of the analog/digital converter is coupled to an input of a comparison circuit.

2. A circuit arrangement, comprising:
a signal processing unit configured to process an input signal to form an analog output signal, the signal processing unit comprising a multiplier; and
a regulation unit coupled to the signal processing unit, and configured to produce a digital regulation signal as a function of the analog output signal for regulation of the analog output signal, and supply the digital regulation signal to a control input of the multiplier,
wherein the signal processing unit comprises:
a signal input configured to receive the input signal;
a further digital/analog converter having an input side coupled to the signal input;
a first filter connected downstream from the further digital/analog converter;
a modulator having an input side coupled to an output of the first filter; and
a power amplifier having an input side coupled to an output of the modulator, and configured to produce the analog output signal at an output side thereof, wherein the output side is configured to couple to an antenna,
wherein the power amplifier comprises a detector, and wherein the regulation unit further comprises an analog/digital converter, wherein an output side of the detector is coupled to the analog/digital converter, and wherein the detector is configured to supply an analog detector signal to the analog/digital converter, and wherein an output side of the analog/digital converter is coupled to an input of a comparison circuit,
wherein the multiplier is arranged between the input and the further digital/analog converter, and wherein an output of the comparison circuit is coupled to the control input of the multiplier, and is configured to influence the digital regulation signal to the multiplier based on a comparison of a digital detector based on the analog detector signal and a reference value.

3. The circuit arrangement of claim 2, wherein the comparison circuit is coupled to still another digital/analog converter, and configured to supply the digital regulation signal to the digital/analog converter, and wherein the digital/analog converter is coupled to the power amplifier and configured to supply the analog regulation signal to the power amplifier.

4. The circuit arrangement of claim 2, wherein the regulation unit further comprises a switching circuit coupled at one input to the comparison circuit, coupled at a first output to the control input of the multiplier, and coupled at a second output to the still another digital/analog converter, wherein the switching circuit is configured to selectively control a supply of the digital regulation signal to the control input of the multiplier or to the still another digital/analog converter.

5. A circuit arrangement, comprising:
a signal processing unit configured to process an input signal to form an analog output signal, the signal processing unit comprising a multiplication circuit; and
a regulation unit coupled to the signal processing unit, and comprising a ramp signal circuit to produce a digital regulation signal based on a ramp signal from the ramp signal circuit and a level of the analog output signal, and configured to control the analog output signal based on the digital regulation signal, wherein the ramp signal circuit is operably coupled to a control input of the multiplication circuit,
wherein the signal processing unit comprises:
a signal input configured to receive the input signal;
a digital/analog converter having an input side configured to receive the digital regulation signal that is a function of the ramp signal; and
a power amplifier comprising one input operably coupled to the signal input, and a further input coupled to the digital/analog converter to receive an analog regulation signal therefrom.

6. The circuit arrangement of claim 5, wherein the ramp signal circuit comprises a memory configured to store values therein, wherein the ramp signal is a function thereof.

7. The circuit arrangement of claim 5, wherein the signal processing unit comprises:
a signal input configured to receive the input signal;
the multiplication circuit coupled at a control input thereof to the ramp signal circuit, and at a further input to the signal input;
a further digital/analog converter having an input side coupled to the multiplication circuit; and
a power amplifier coupled at one input to the further digital/analog converter, and configured to provide the analog output signal at the output side thereof.

8. A method for setting an analog output signal, comprising:
producing a digital regulation signal as a function of an analog output signal; and
processing an input signal to form the analog output signal by setting solely one operating mode at a time out of a set comprising a first and a further operating mode, wherein in the first operating mode, the input signal or a digital signal derived therefrom is modified by the digital regulation signal, and in the further operating mode, an analog signal derived from the input signal is amplified as a function of an analog regulation signal from which the digital regulation signal is converted.

9. The method of claim 8, wherein in the further operating mode the input signal, or the signal derived therefrom is converted to an analog signal, the converted analog signal is filtered and modulated such that a modulated signal is produced, and the modulated signal is amplified as a function of the analog regulation signal such that the analog output signal is produced.

10. The method of claim 8, wherein in the first operating mode the input signal or the signal derived therefrom is multiplied by the digital regulation signal such that a multiplied signal is produced, the multiplied signal is converted to an analog signal, the converted analog signal is filtered and modulated such that a modulated signal is produced, and the modulated signal is amplified such that the analog output signal is produced.

11. The method of claim 8, wherein producing the digital regulation signal as a function of an analog output signal comprises:
producing an analog detector signal as a function of the analog output signal;
converting the analog detector signal to a digitized detector signal;
producing a reference signal;
comparing the digitized detector signal or a signal derived therefrom with the reference signal; and
producing the digital regulation signal as a function of the comparison result.

12. The method of claim 11, wherein producing the reference signal comprises producing a ramp signal and basing the reference signal thereon.

13. The method of claim 12, wherein producing the ramp signal comprises reading one or more stored values from a memory.

* * * * *